(12) United States Patent
Tanaka et al.

(10) Patent No.: US 9,280,047 B2
(45) Date of Patent: Mar. 8, 2016

(54) IMPRINT APPARATUS AND ARTICLE MANUFACTURING METHOD

(75) Inventors: Yusuke Tanaka, Utsunomiya (JP); Hirotoshi Torii, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 676 days.

(21) Appl. No.: 13/568,501

(22) Filed: Aug. 7, 2012

(65) Prior Publication Data

US 2013/0037981 A1 Feb. 14, 2013

(30) Foreign Application Priority Data

Aug. 11, 2011 (JP) .................................. 2011-175897

(51) Int. Cl.
*B29C 59/02* (2006.01)
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)

(58) Field of Classification Search
CPC ........... B29C 59/022; B29C 2059/023; G03F 7/0002
See application file for complete search history.

(56) References Cited

U.S. PATENT DOCUMENTS

| 6,087,053 | A | 7/2000 | Hara | |
|---|---|---|---|---|
| 2006/0279004 | A1* | 12/2006 | Suehira et al. | 257/797 |
| 2007/0132157 | A1* | 6/2007 | Tokita et al. | 264/494 |
| 2010/0015270 | A1* | 1/2010 | Choi et al. | 425/149 |

FOREIGN PATENT DOCUMENTS

| CN | 1876395 A | 12/2006 |
|---|---|---|
| CN | 101009218 A | 8/2007 |
| CN | 101059650 A | 10/2007 |
| CN | 101573659 A | 11/2009 |
| JP | 2010-080714 A | 4/2010 |
| JP | 2011-000885 A | 1/2011 |
| KR | 10-0771747 B1 | 10/2007 |
| KR | 10-2010-0131375 A | 12/2010 |
| TW | 200522155 A | 7/2005 |
| TW | 2010018570 A | 5/2010 |
| TW | 201107120 A | 3/2011 |

\* cited by examiner

*Primary Examiner* — James Sanders
(74) *Attorney, Agent, or Firm* — Canon USA, Inc. I.P. Division

(57) ABSTRACT

An imprint apparatus that molds an imprint material on a substrate using a mold, and forms a pattern on the substrate, the imprint apparatus includes a mold holding unit configured to hold the mold, which includes a surface including a pattern area, a substrate holding unit configured to hold the substrate, a first acquisition unit configured to acquire information concerning a difference in shape between the pattern area and a shot already formed on the substrate, and a control unit configured to control at least one of the mold holding unit and the substrate holding unit to adjust a spacing between the mold and the substrate, based on the information concerning the difference in shape acquired by the first acquisition unit, in a state where the pattern area and the imprint material are in contact with each other.

14 Claims, 5 Drawing Sheets

IMPRINT APPARATUS AND ARTICLE MANUFACTURING METHOD

BACKGROUND OF THE INVENTION

1. Field of the Invention

The present invention relates to an imprint apparatus, and more particularly, to an imprint apparatus in which a mold on which a pattern is formed, and an imprint material disposed on a substrate surface are pressed against each other, thereby the pattern of the mold is transferred onto the imprint material.

2. Description of the Related Art

Nanoimprint is known as a method of forming fine patterns in semiconductor device or a micro electro mechanical systems (MEMS) or the like. The nanoimprint is a technology for bringing a mold on which a fine pattern is formed by an electron beam exposure or the like into contact with a substrate formed of a wafer or a glass or the like on which an imprint material (resin material such as resist) is applied, thereby transferring the pattern onto the resin which is the imprint material.

When a nanoimprint is performed, it is necessary to conform a magnification (size) of the pattern formed on the wafer to a magnification of the pattern to be transferred onto the mold. However, the entire wafer enlarges or reduces in the course of heating process such as film formation or sputtering, and as a result, the magnification of the pattern can differ between in X-direction and Y-direction. In actual semiconductor process, variable magnification of the entire wafer on the order of ±10 ppm occurs, and magnification difference between the X-direction and Y-direction on the order of 10 ppm occurs.

In a conventional lithography such as a stepper or a scanner, variable magnification is addressed by altering each shot size during exposure in conformity to a deformation of the wafer. For example, in the case of a scanner, reduction magnification of a projection optical system is altered on the order of several ppm in conformity to a magnification of the wafer, furthermore a scanning speed is altered several ppm in conformity to a magnification of the wafer. In this way even when magnification difference occurs between the X-direction and Y-direction, high overlay accuracy is realized by correcting the magnifications.

However, since there is no projection optical system in the nanoimprint, like in conventional lithography, and the mold and the wafer come into direct contact with each other via a resin, such a correction cannot be made.

Thus, in the nanoimprint, another approach is used to correct a variable magnification of the pattern which is generated during semiconductor process as described above. In order to conform the pattern formed on the mold to a magnification of the pattern of wafer, a magnification correction mechanism for physically deforming the mold is employed. As a method for physically deforming the mold, a method for deforming by exerting an external force from an outer periphery of the mold, or a method for expanding the mold by heating the mold are adopted.

As an application example of the imprint apparatus, lithography of the semiconductor device on the order of 32 nm half pitch is considered. At this time, according to the International Technology Roadmap for Semiconductors (ITRS), overlay accuracy is 6.4 nm. Therefore, it is also necessary to control the magnification correction with accuracy of several nanometers or less.

In the lithography using the imprint apparatus as described above, it is necessary to correct a shape of the pattern to be transferred. For example, distortion can occur on the pattern to be transferred. The causes include the following points. For example, the pattern side faces upward during fabrication, while the pattern side faces downward during usage (during pressing), that is, the mold has different orientations. Consequently, the pattern is deformed by an influence of gravity or the like. Also, when the pattern is formed on the mold by electron beams or the like, distortion of pattern image can occur on the mold due to distortion aberration of an optical system of an electron beam rendering device. Further, even supposing that the pattern of the mold could be manufactured without distortion, the overlay accuracy will become worse if distortion has occurred in the pattern on the substrate. A difference in shapes between the pattern already formed on the substrate and the pattern formed on the mold, which will lead to such a deterioration of the overlay accuracy, is called a distortion (aberration).

In the imprint apparatus, a magnification correction mechanism is mounted to correct these distortions. In the magnification correction mechanism, the mold is physically deformed within an X-Y plane in order to correct the mold in a target shape. However, when a shape of the mold is corrected as illustrated in FIG. 5A, the pattern area will be also deformed in a pressing direction (Z-direction) by its own weight or the like. Further, a deformation amount in the Z-direction varies depending on the shape to be corrected of the mold. Such a deformation in the Z-direction of the mold causes occurrence of pattern distortion during pressing and the overlay accuracy becomes worse.

Japanese Patent Application Laid-Open No. 2010-080714 discusses a control method for inhibiting such a deformation of the mold. According to Japanese Patent Application Laid-Open No. 2010-080714, a mold chuck includes a base portion and a holding portion for holding a plurality of peripheral portions of the mold and a driving mechanism for positioning the holding portion relative to the base portion, and corrects a shape of the mold so as to follow a shape of the wafer by driving the holding portion, thus improving the overlay accuracy.

However, in order to attain an imprint in which accuracy of several nm or less is required even in the magnification correction as described above, there is an additional issue. The issue includes the fact that the pattern will be deformed when the pattern formed on the mold is transferred by being pressed against the substrate, in the imprint apparatus. When the mold is pressed against the substrate as illustrated in FIG. 5B, if the spacing between the mold and the substrate is rendered too small, a large distortion occurs outside the pattern of the mold. Further, if the spacing between the mold and the substrate is rendered too large, similarly a large distortion occurs outside the pattern of the mold. As a result, even when pressed after correcting such that the distortion becomes small by the magnification correction mechanism, the distortion results in occurring by deformation when the mold is pressed. In this case, the overlay accuracy becomes significantly worse especially near the outer periphery portion of the pattern. Therefore, it is necessary to properly determine a distance between the mold and the substrate when the pattern is transferred such that the distortion becomes small in the outer periphery portion of the pattern of the mold.

SUMMARY OF THE INVENTION

According to an aspect of the present invention, an imprint apparatus that molds an imprint material on a substrate using a mold, and forms a pattern on the substrate, the imprint apparatus includes a mold holding unit configured to hold the mold, which includes a surface including a pattern area, a substrate holding unit configured to hold the substrate, a first acquisition unit configured to acquire information concerning a difference in shape between the pattern area and a shot already formed on the substrate, and a control unit configured to control at least one of the mold holding unit and the substrate holding unit to adjust a spacing between the mold and the substrate, based on the information concerning the difference in shape acquired by the first acquisition unit, in a state where the pattern area and the imprint material are in contact with each other.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
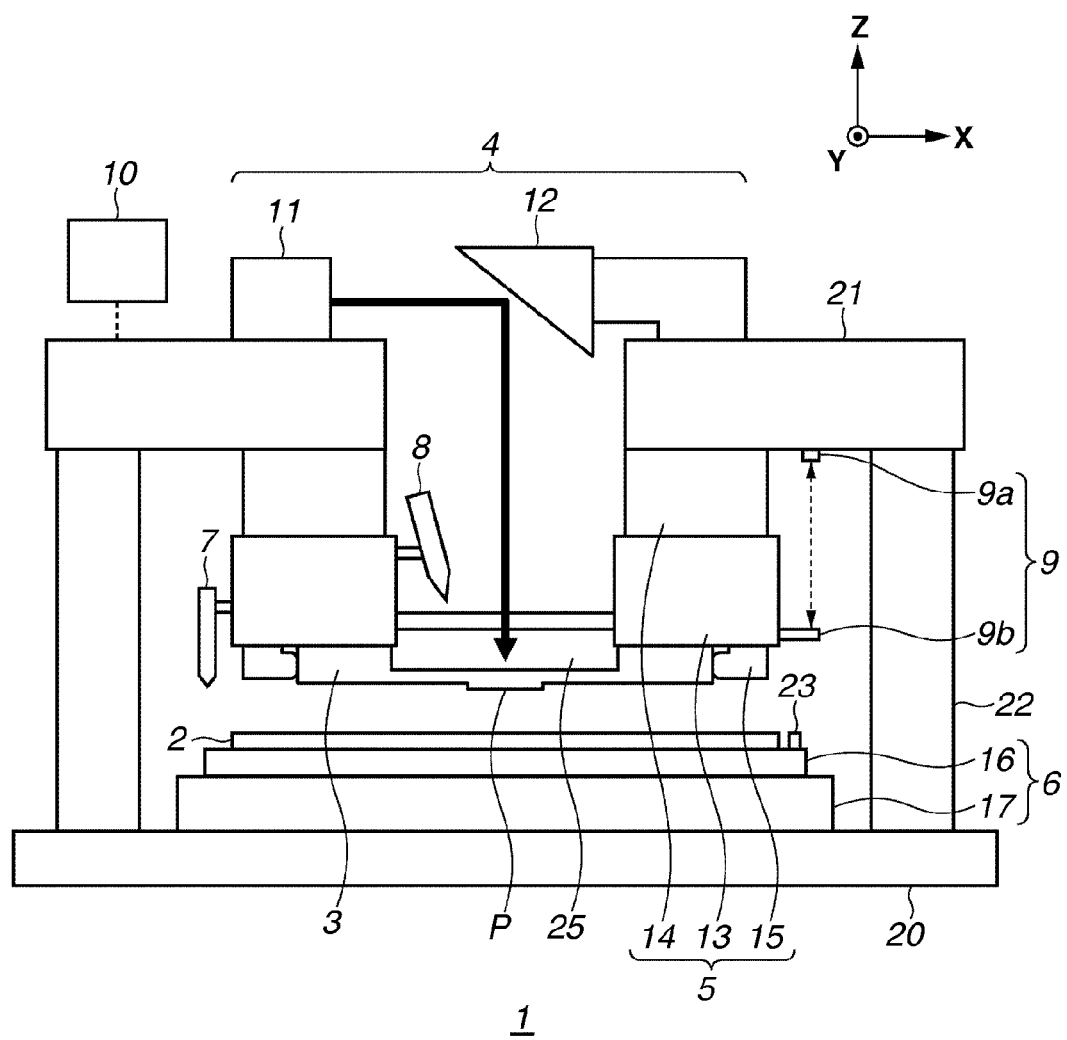
FIG. 1 is a schematic view illustrating an imprint apparatus according to an exemplary embodiment of the present invention.

FIG. 1 is a configuration view of an imprint apparatus 1 according to an exemplary embodiment of the present invention. The imprint apparatus in the present exemplary embodiment is an imprint apparatus that transfers concave and convex pattern of a mold onto an imprint material which has been supplied onto a substrate such as a wafer or glass, which is a baseboard to be processed, used in semiconductor device manufacturing step. Further, the imprint apparatus adopts, among imprinting techniques, an approach for curing a resin by a light when the concave and convex pattern of the mold is transferred.

As illustrated in FIG. 1, an axis parallel to a direction in which the mold is irradiated with an ultraviolet light is taken as Z-axis, and X-axis and Y-axis are defined as directions orthogonal to the Z-axis. The Z-axis is also an axis parallel to a direction in which at least one of the mold and the substrate moves when the spacing between the mold and the substrate is narrowed, in order to bring a pattern area of the mold into contact with the imprint material on the substrate.

The imprint apparatus 1 according to the present invention includes a mold 3, an illumination unit 4, a mold holding unit 5, a substrate holding unit 6, a dispenser 7, an alignment measurement unit 8, a distance between substrate and mold measurement unit 9, and a control unit 10.

A substrate 2 is a substrate to be processed, which uses, for example, single crystal silicon wafer or silicon on insulator (SOI) wafer, glass substrate, and is held by the substrate holding unit 6. An ultraviolet curable resin (hereinafter, simply written as "resin") as the imprint material which becomes a molding portion is supplied to a processed surface of the substrate 2. The imprint material is also called resist in the manufacturing field of semiconductor devices.

The mold 3 is provided with a concave and convex pattern, which is formed in a three-dimensional shape, on a surface rectangular in an outer periphery portion and opposed to the substrate 2. The concave and convex pattern is to be transferred onto a resin which has been supplied to the substrate 2. The mold 3 has a periphery portion and a pattern area P (area where the concave and convex pattern described above is formed) protruding from the periphery portion, on the surface opposed to the substrate 2. Raw material which transmits ultraviolet light such as quartz is used for material of the mold 3.

The illumination unit 4 irradiates the mold 3 with the ultraviolet light, when imprint processing is performed. The illumination unit 4 includes a light source 11, and a plurality of optical elements 12 for adjusting the ultraviolet light irradiated from the light source 11 to a light suitable for imprinting. In the present exemplary embodiment, as the imprint material, photo-curing resin is used, but it is not necessary to limit to the photo-curing resin. For example, heat-curing resin may be used, and in that case, a heat source unit (not illustrated) for curing the resin becomes necessary, instead of the illumination unit 4.

The mold holding unit 5 holds and fixes the mold 3, and is used to imprint the concave and convex pattern of the mold 3 onto the substrate 2. The mold holding unit 5 includes a mold chuck 13, a mold stage 14, and a magnification correction mechanism 15 as a deformation unit for subjecting the mold 3 to deformation. The mold chuck 13 holds and fixes the mold 3 by a mechanical holding unit (not illustrated). Further, the mold chuck 13 is held in the mold stage 14 by the mechanical holding unit (not illustrated). Further, the mold chuck 13 holds the surface provided with the pattern area P and its periphery portion facing toward the substrate side.

The mold stage 14 is a driving system for positioning the spacing between the substrate 2 and the mold 3 when the concave and convex pattern formed on the pattern area P of the mold 3 is transferred to the substrate 2, and performs driving in the Z-axial direction. Further, the mold stage 14 may be a driving system for determining an inclination of the mold 3, and may drive the mold 3 in an ωx (rotation around the X-axis) direction, or in an ωy (rotation around the Y-axis) direction. In this way, the mold stage 14 may be constituted by a plurality of driving systems such as a coarse-motion driving system and a fine-motion driving system, since highly accurate positioning is required during pattern transfer.

Furthermore, the mold 3 may be provided with positional adjustment function not only in the Z-axial direction, but also in the X-axial direction, the Y-axial direction, or θ (rotation around the Z-axis) direction, and a tilt function for correcting the inclination of the mold 3. For example, the mold stage 14, by including a plurality of actuators which performs driving in the Z-direction, can control a drive amount and an inclination in the Z-axial direction according to drive amounts of respective actuators.

In the mold chuck 13 is arranged a magnification correction mechanism (deformation mechanism) 15 for correcting a shape of the mold 3. The magnification correction mechanism 15 may be a deformation mechanism that deforms the shape of the mold 3 by exerting forces or displacements to side surfaces of the mold 3.

Accordingly, a shape of the pattern area P is deformed, and the concave and convex pattern formed on the pattern area P can be corrected to be aligned with a shape of the pattern of a shot region already formed on the substrate. In this case, as described above, the Z-axial direction is also an axis parallel to a direction in which at least one of the mold and the substrate moves, when the spacing between the mold 3 and the substrate is narrowed in order to bring the pattern area P of the mold 3 into contact with the imprint material on the substrate 2. In other words, the magnification correction mechanism 15 is used to exert a force or a displacement from two directions orthogonal to each other in a vertical surface relative to a direction (narrowing direction) in which the spacing between the mold 3 and the substrate 2 is adjusted relative to the mold 3.

The substrate holding unit 6 holds the substrate and performs an alignment between the substrate 2 and the mold 3 at the time of imprinting. The substrate holding unit 6 includes a substrate chuck 16, and a substrate stage 17. The substrate chuck 16 holds the substrate 2 by a mechanical holding unit (not illustrated). Further, the substrate chuck 16 is held in the substrate stage 17 by the mechanical holding unit (not illustrated).

The substrate stage 17 is a driving system that performs driving in the X-axial direction and Y-axial direction to perform an alignment between the substrate 2 and the mold 3. Further, the driving system in the X-axial direction and the Y-axial direction may be constituted by a plurality of driving systems such as the coarse-motion driving system and fine-motion driving system. Furthermore, the substrate stage 17 may include a driving system for positional adjustment in the Z-axial direction, a positional adjustment function in the θ (rotation around the Z-axis) direction of the substrate 2, or a tilt function for correcting an inclination of the substrate 2.

The dispenser 7 is a supply unit for supplying a resin onto the substrate 2. The dispenser includes a resin discharge nozzle (not illustrated), and drops the resin from the resin discharge nozzle onto the substrate 2. It is required to use a resin which has a property of curing by being irradiated with the ultraviolet light. Further, an amount of the resin to be discharged may be determined by necessary thickness of resin or a pattern density to be transferred or the like.

In the present exemplary embodiment, at least one of the driving systems which drive the mold holding unit 5 or the substrate holding unit 6 in the Z-axial direction is called a spacing adjustment mechanism. Naturally, the spacing between the substrate 2 and the mold 3 may be adjusted by both the mold holding unit 5 and the substrate holding unit 6. Further, at least one of the driving systems for adjusting inclinations of the mold holding unit 5 and the substrate holding unit 6 is called an inclination adjustment mechanism. Similarly, inclinations of the substrate 2 and the mold 3 may be adjusted by both the mold holding unit 5 and the substrate holding unit 6. Further, the spacing adjustment mechanism may be provided with a function for adjusting the inclinations.

The alignment measurement unit 8 measures positional deviations in the X-axial direction and Y-axial direction between an alignment mark formed on the substrate 2 and an alignment mark formed on the mold 3. In other words, the alignment measurement unit 8 functions as a unit (first acquisition unit) that acquires information concerning difference in shapes between the pattern area P and the shot already formed on the substrate. More specifically, the alignment measurement unit 8 obtains information concerning relative positions between a plurality of marks included in the concave and convex pattern formed on the pattern area P and a plurality of marks included in the shot corresponding to the plurality of marks, to acquire the information as information concerning a difference in shape of the pattern.

The distance measurement unit 9 which measures a spacing between the substrate 2 and the mold 3 is a second acquisition unit which acquires information concerning the spacing between the substrate 2 and the mold 3 by measuring the spacing between the substrate 2 and the mold 3. For example, the distance measurement unit 9 may be configured as a laser interferometer including a measurement section 9a including a light-emitting section and a light-receiving section (not illustrated) and a reflection section 9b including a reflection mirror. In this case, the measurement unit 9a measures a distance (height) relative to the measurement unit 9a by measuring a position of the reflection unit 9b using interference of a laser light.

In this regard, information of distances (heights) of the substrate holding unit 6 and the substrate 2 in the Z-axial direction relative to the measurement section 9a is known. Further, information of distances (heights) between the reflection section 9b or the measurement section 9a, and the pattern area P (especially, the surface opposed to the substrate 2) and the peripheral portion of the pattern area P (especially, a portion close to the magnification correction mechanism 15) is also known. If the information of these distances is available, it becomes possible to acquire the information concerning the spacing between the substrate 2 and the mold 3, by calculations or the like according to a configuration to be used.

In this process, as the information concerning the spacing between the substrate 2 and the mold 3, the spacing (distance or height) between the peripheral portion (especially, the portion close to the magnification correction mechanism 15) of the pattern area P and the substrate 2 generated using the above-described information are assumed to be used. Further, the distance measurement unit 9 can measure an inclination of the mold 3. An inclination of the mold 3 can be measured by measuring the spacing between the mold 3 and the substrate 2 by the distance measurement unit 9 at a plurality of positions. The inclination of the mold 3 herein used indicates an inclination of the mold 3 relative to a plane of the substrate 2.

The control unit 10 controls an operation and an adjustment of each constituent element of the imprint apparatus 1. For example, the control unit 10 performs control of the mold stage 14 and the magnification correction mechanism 15 which constitutes the mold holding unit 5.

Additionally, the imprint apparatus 1 includes a mold conveyance unit (not illustrated) for conveying the mold 3 to the mold holding unit 5, and a substrate conveyance unit (not illustrated) for conveying the substrate 2 to the substrate holding unit 6. Further, the imprint apparatus 1 includes a base surface plate 20 for holding the substrate holding unit 6, a bridge surface plate 21 for holding the mold holding unit 5, and a supporting post 22 for supporting the bridge surface plate 21. Further, the substrate chuck 16 includes a reference mark 23 which is used when performing alignment of the mold 3.

Further, the imprint apparatus 1 may include a cavity 25 for deforming the mold 3 on a back surface of the mold 3. A pressure in the cavity 25 can be varied as needed, and the cavity 25 may be controlled by the control unit 10, alternatively may be controlled by providing separate cavity pressure control unit (not illustrated). A pressure control mechanism is constituted by the control unit 10 and the cavity 25. For example, when the mold 3 is pressed against the substrate 2 in a state where a cavity pressure is made higher than the outside and the pattern is deflected in downward (convex) direction, the mold 3 comes into contact with the resin on the substrate 2 starting at the center part of the pattern. As a result, air is prevented from being entrapped between the resin and the mold 3, and pattern defect due to unfilling can be reduced.

In the present exemplary embodiment, one important focusing point is that, in a case where the pattern area P and the substrate 2 come into contact with each other while sandwiching the imprint material therebetween, surface tension is very strong. Since the pattern area P is in contact with the substrate 2 by a very strong force, the contacting portion refuses to be separated by a small force. In other words, once the pattern area P has come into contact with the substrate 2 while sandwiching the imprint material therebetween, the state is supposed to become stable at a spacing of a predetermined thickness of a predetermined imprint material. By adjusting the spacing between the mold 3 and the substrate 2 in this state, deformation to the pattern area P can be created.

Figure 2A:
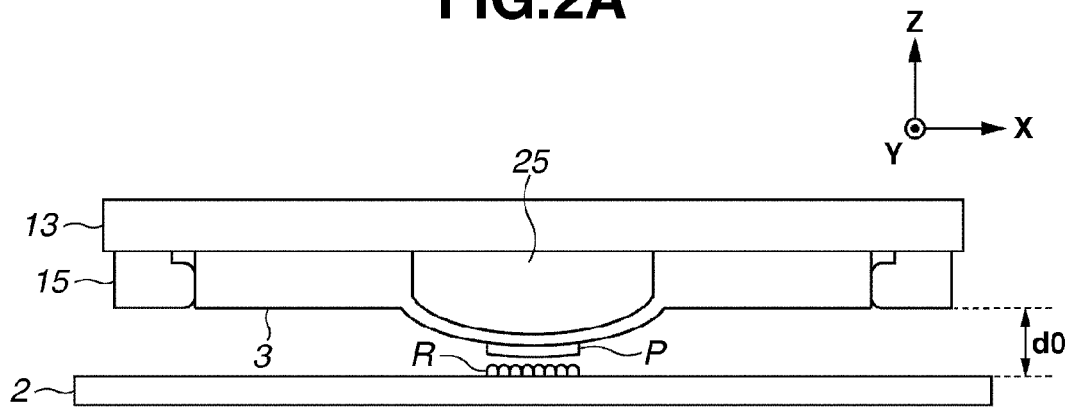
FIGS. 2A, 2B, 2C, and 2D illustrate positional relationship between a substrate and a mold during imprinting.
Figure 2B:
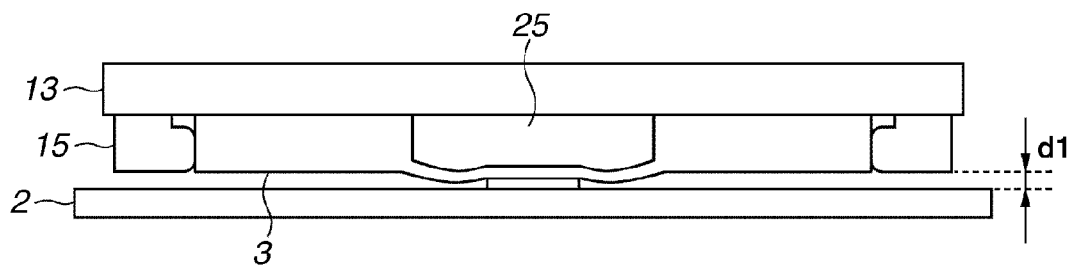

The first exemplary embodiment will be described. An operation of the imprint apparatus 1 will be described with reference to FIG. 1, FIGS. 2A to 2D, and FIG. 3. FIG. 3 is an operation sequence when a pattern of a certain layer is imprinted, using the same mold for a plurality of sheets of substrates. On each substrate of the plurality of sheets of substrates, there is a plurality of shot regions having already formed patterns, and imprinting by the mold is of course performed on a shot-by-shot basis.

In FIG. 3, in step S101, the mold 3 is mounted on the mold chuck 13 by the mold conveyance unit 18 (not illustrated).

In step S102, the alignment measurement unit 8 measures a deviation between the reference mark 23 and the alignment mark of the mold 3 in the X-axial direction, and Y-axial direction and θ (rotation around the Z-axis) direction. Then, based on the measurement result, the alignment measurement unit 8 performs alignment of the reference mark 23 and the alignment mark of the mold 3.

In step S103, the substrate 2 is attached to the substrate chuck 16 by a substrate conveyance unit 19 (not illustrated).

In step S104, the substrate 2 is moved to an applying position of the dispenser 7 by a substrate stage 17.

In step S105, liquid resin is applied on the substrate 2 by the dispenser 7.

In step S106, the substrate 2, on which the resin is applied, is moved to a pressing position by the substrate stage 17.

In step S107, the mold 3 and the resin applied on the substrate 2 are brought into contact with each other by the mold stage 14. At this time, the spacing between the mold 3 and the substrate 2, while being measured by the distance measurement unit 9, is controlled by the mold stage 14 to attain a spacing which allows an overlay accuracy to become best. The spacing between the mold 3 and the substrate 2 only needs to be calculated so that the overlay accuracy becomes highest, by beforehand performing patterning and implementing overlay inspections, based on results of the overlay inspections and distortion information of the pattern.

Herein, an example of measuring the spacing between the mold 3 and the substrate 2 has been described, but the inclination of the mold 3 may be determined using the distance measurement unit 9. Alternatively, the spacing and inclination of the mold 3 may be concurrently measured. When the resin and the mold come into contact with each other, the inclination of the mold 3, while being measured by the distance measurement unit 9, is controlled by the mold stage 14 to attain an inclination which allows the overlay accuracy to become best.

Alternatively, without performing in advance the overlay inspection, pressing operation may be performed while measuring positional deviation between the mold 3 and the substrate 2 by the alignment measurement unit 8 each time the mold 3 is pressed, and the pressing position may be determined so that the overlay accuracy becomes best. In this case, it is only necessary to perform, for example, a control as described below. First, based on the positional deviation between the mold 3 and the substrate 2 measured by the measurement unit 8, a pressing position and an inclination are varied by very small amount so that the overlay accuracy is improved. Again the positional deviation is measured by the measurement unit 8, and the pressing position and the inclination are varied according to a magnitude of the positional deviation. By repeating the above operations, until the overlay accuracy becomes a desired value, final pressing position and inclination are determined.

Further, the mold 3 may be pressed against the resin coated on the substrate 2, by driving, in the Z-axial direction, the substrate holding unit 6, or both the mold holding unit 5 and the substrate holding unit 6. Furthermore, imprinting operation may be performed, by driving the substrate holding unit 6, or both the mold holding unit 5 and the substrate holding unit 6 while varying the inclination.

Further, after once having pressed to a narrower spacing than the spacing between the mold 3 and the substrate 2 defined such that the overlay accuracy becomes best during pressing, the mold 3 may be returned to the defined spacing. Deformation of the mold 3 at this time will be described with reference to FIGS. 2A to 2D. A state before the mold 3 is pressed against the substrate 2 is illustrated in FIG. 2A. As illustrated in FIG. 2A, the pattern area of the mold 3 is deformed due to gravity or residual stress generated during the process, and as the spacing between the mold 3 and the substrate 2 is narrowed in this state, it is considered that the pattern comes into contact with the resin from the center of the pattern. As the spacing between the mold 3 and the substrate 2 is gradually narrowed like this, a contacting area between the pattern area of the mold and the resin is gradually spreading from the center.

Figure 2C:
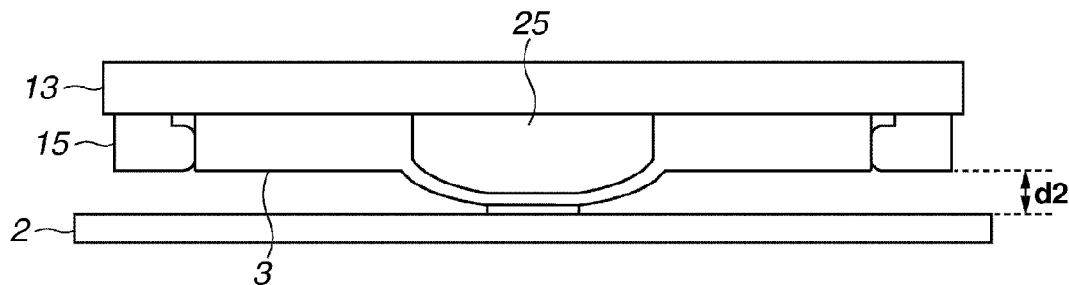
Figure 3:
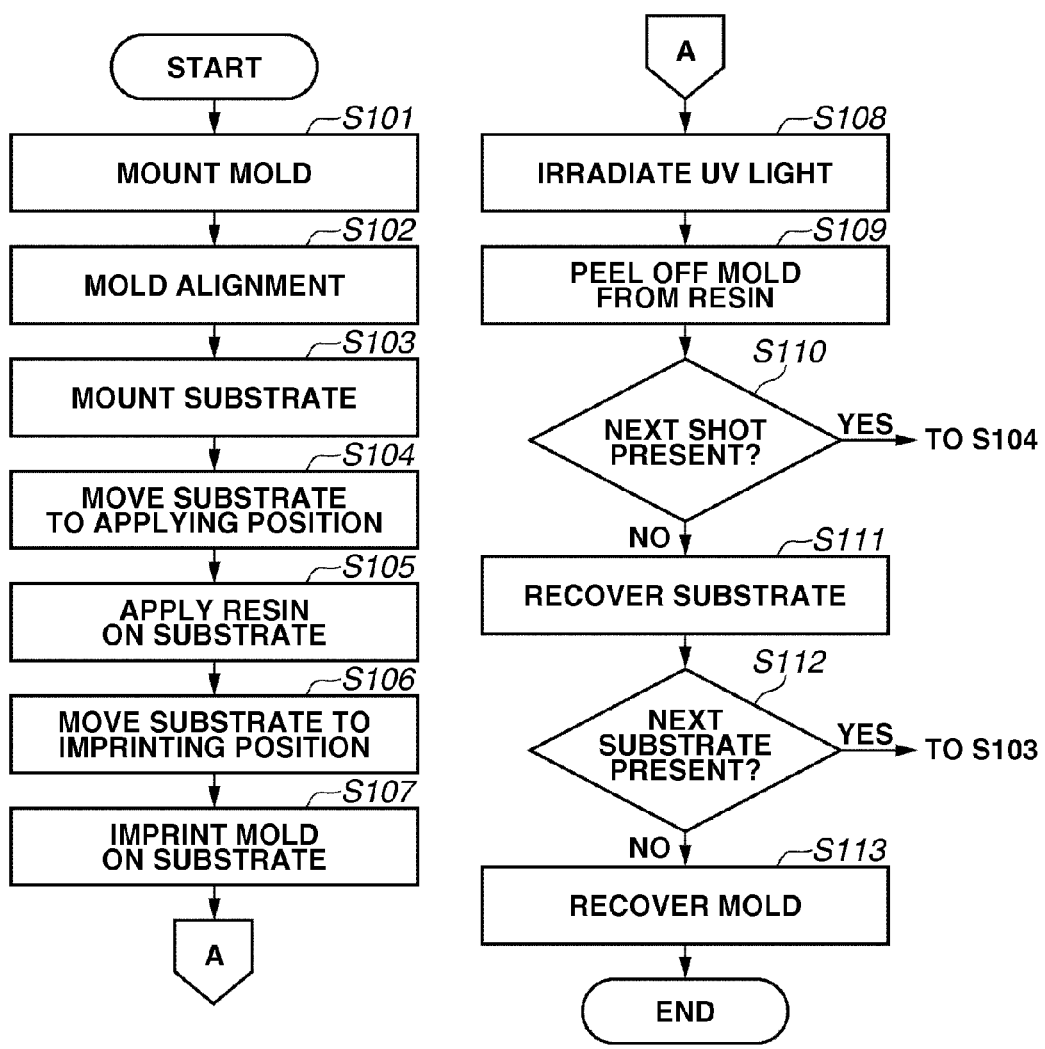
FIG. 3 illustrates a flow of imprinting according to a first exemplary embodiment of the present invention.

In this process, when pressing is stopped at an optimal spacing as illustrated in FIG. 2C, there is a possibility that the process proceeds to the next step, while the resin remains not fully in contact with the outer periphery portion of the pattern. Thereupon, once the spacing between the mold 3 and the substrate 2 has been made smaller than an optimal state as illustrated in FIG. 2B, the resin surely comes into contact with the outer periphery portion of the pattern. Once the resin applied on the substrate 2 and the mold 3 have come into contact with each other, surface tension works, and even when the substrate 2 and the mold 3 are spaced apart from each other, the pattern area and resin on the substrate 2 become hard to be separated from each other by the action of the surface tension. Therefore, after that, by returning to the optimal spacing (spacing d2) as illustrated in FIG. 2C, the process can proceed to the next step in a state where the resin and the pattern are surely in contact with each other.

Figure 2D:
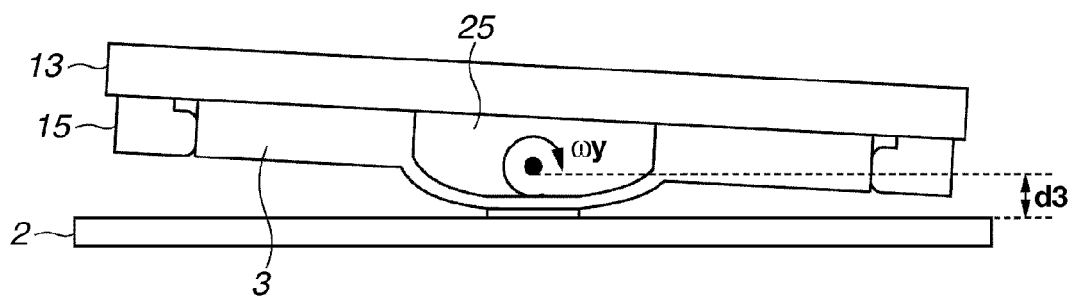

Next, in addition to the above-described control of the spacing, a case of controlling the inclinations of the substrate 2 and the mold 3 will be described. When the mold 3 and the substrate 2 are pressed against each other in an inclined state, the mold 3 comes into contact with the substrate 2 (resin on the substrate) from an end of the pattern area P. In this way when the mold, in an inclined state, comes into contact with the substrate, surface tension works in contacted portions, and the pattern is at a risk of being distorted by stress. Therefore, when an inclination of the mold 3 is adjusted, in a state where the mold 3 and the substrate 2 remain parallel to each other, the spacing between the mold 3 and the substrate 2 is made smaller than an optimal state (spacing d1), as illustrated in FIG. 2B. After that, it is desirable to adjust to a spacing d3 and to adjust an inclination ωy of the mold 3 as illustrated in FIG. 2D.

Although a control is performed to attain an optimal pressing state by varying a distance between the mold 3 and the substrate 2 in the above-described exemplary embodiment, the control may be performed to attain an optimal pressing state by varying a pressing force of the mold 3 against the substrate 2. In that case, the mold holding unit 5 or the substrate holding unit 6 needs to include a pressing force measurement mechanism (not illustrated). The pressing force measurement mechanism 27 may directly measure a force by a load cell or the like, or may calculate a pressing force from measured values of electric currents of a motor or the like. Alternatively, in the case of being driven by an air pressure, the pressing force measurement mechanism 27 may calculate a pressing force by a valve pressure measurement value. Further, the mold stage 14, if constituted by a plurality of actuators, can control an inclination of the mold 3 by an output force ratio of each actuator.

In step S108, the resin is pressed by the mold 3 and the resin is cured by an UV light irradiated from the illumination unit 4.

In step S109, the mold 3 is lifted by the mold stage 14, and the mold 3 is separated off from the cured resin on the substrate 2.

In step S110, determination whether there is a shot to which a pattern is subsequently transferred is performed. If there is a shot to be transferred, the process returns to step S104. If there is no shot to be transferred, the process proceeds to step S111.

In step S111, the substrate 3 is recovered from the substrate holding unit 6 by the wafer conveyance unit.

In step S112, determination is performed whether there is a substrate to which pattern transfer is subsequently performed. If there is a substrate to which a pattern is transferred, the process returns to step S103. If there is not a substrate to which a pattern is transferred, the process proceeds to the next step S113.

In step S113, the mold 3 is recovered from the mold holding unit 5 by the mold conveyance unit 18, and all steps end.

Figure 4:
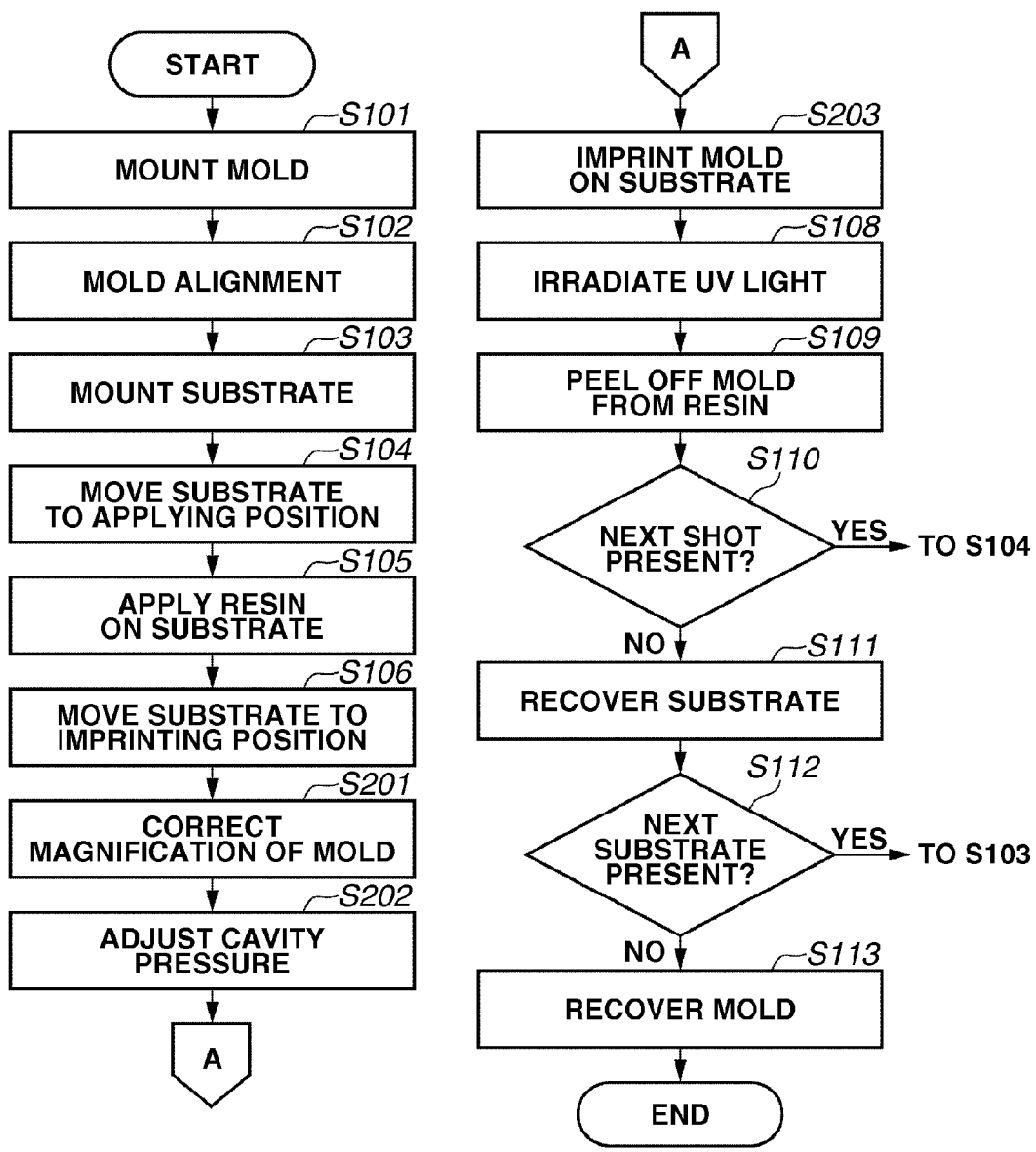
FIG. 4 illustrates a flow of imprinting according to a second exemplary embodiment of the present invention.
Figure 5A:
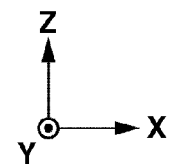
FIGS. 5A and 5B illustrate positional relationship between the substrate and the mold during imprinting which describes prior art.
Figure 5A:
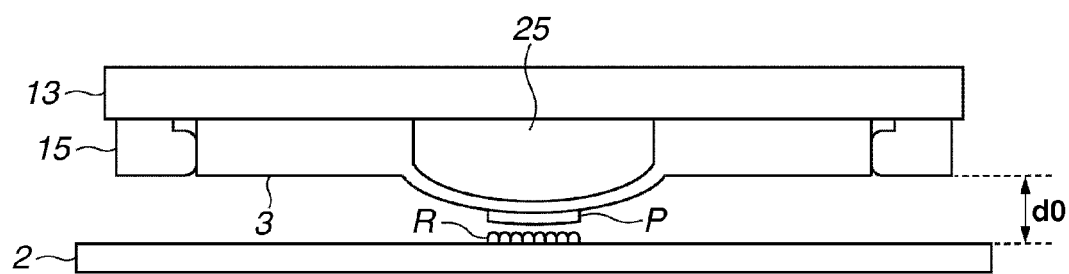
Figure 5B:
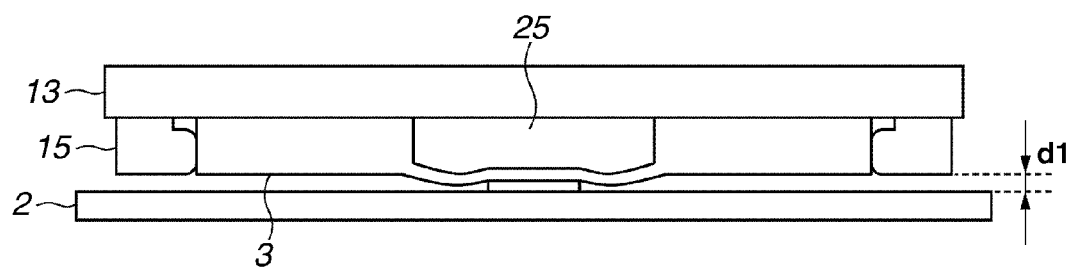

A second exemplary embodiment will be described. An operation of the imprint apparatus including the magnification correction mechanism 15 and the cavity pressure control unit will be described with reference to FIG. 1, FIG. 3, and FIG. 4. FIG. 4 is a flow chart in which the portion which corresponds to step S107 in FIG. 3 is rewritten to a sequence in the imprint apparatus including the magnification correction mechanism 15.

After going through the processing from step S101 to step S106 in FIG. 3, the process advances to step S201 in FIG. 4, and then after going through the processing in step S203, the process proceeds to step S108. The processing from step S101 to step S106 and from step S108 to step S113 are same as those in the first exemplary embodiment and thus descriptions thereof will not be repeated.

In step S201, the mold 3 is deformed to a desired shape by the magnification correction mechanism 15, based on magnification correction data and distortion information of the pattern obtained as the results of beforehand implementing patterning operations and conducting the overlay inspections.

In step S202, a control of the cavity pressure is performed using cavity pressure data obtained as the results of beforehand performing the patterning operations by varying cavity pressures and conducting the overlay inspections. The mold 3 is deformed to the desired shape by exerting pressure to the back surface of the mold 3 by the cavity pressure control unit, based on the cavity pressure data and distortion information of the pattern.

In step S203, the mold 3 is pressed, by the mold stage 14, against the resin applied on the substrate 2. When the resin and the mold 3 come into contact with each other, the patterning operation is performed beforehand while varying the spacing between the mold 3 and the substrate 2, and the spacing data between the substrate 2 and the mold 3 obtained from the results of the overlay inspections is accumulated. As the accumulated data, in addition to spacing data between the mold 3 and the substrate 2, the data obtained from the results of varying inclinations and magnifications, and cavity pressures can be accumulated. Further, distortion information of the pattern of the substrate 2 is also measured in advance. The control is performed based on the above-described accumulated data and distortion information of the pattern of the substrate 2. Based on the spacing data of pressing and the corresponding distortion information of the pattern, the spacing between the mold 3 and the substrate 2 is measured by the distance measurement unit 9, and is controlled by the mold stage 14 as a spacing adjustment mechanism to attain such a spacing which allows the overlay accuracy to become best. If the data obtained from the results of varying inclinations, magnifications, and cavity pressures is used, inclinations, magnifications, and cavity pressures can be controlled, so that the overlay accuracy becomes best, based on the accumulated data and distortion information.

Also in the above-described exemplary embodiment, similarly to the first exemplary embodiment, after temporarily pressing to a spacing narrower than the spacing between the mold 3 and the substrate 2 defined such that the overlay accuracy becomes best during pressing, the spacing between the mold 3 and the substrate 2 may be returned to the defined spacing or inclination. Further, positional relationship between the mold 3 and the substrate 2 may be also controlled by pressing forces instead of distances or inclinations.

After the processing in step S203 in FIG. 4 ends, the process proceeds to step S108.

The order of step S201, step S202 and step S203 is not limited thereto. For example, in step S202, a shape of the mold 3 is deformed by the cavity pressure control unit, then in step S203, the mold 3 is pressed against the substrate 2 by the mold stage 14, and after that, in step S201, the mold 3 may be again deformed by the magnification correction mechanism 15.

Further, while controlling the spacing between the substrate 2 and the mold 3 or the inclination by the mold stage 14, a shape of the mold 3 may be varied in parallel by the magnification correction mechanism 15 or the cavity pressure control unit. Furthermore, the mold 3 may be deformed by only one of the magnification correction mechanism 15 and the cavity pressure control unit. In other words, the mold 3 may be deformed by either one of step S201 and step S202. In any of these cases, it is only necessary to perform respective overlay inspection beforehand, and to determine cavity pressures, distances and inclinations between the mold and the substrate, and magnification correction amounts, such that the overlay accuracy becomes small, based on the results thereof and distortion information of the pattern.

Further, instead of determining a control amount based on the results of the overlay inspections after performing patterning in advance, pressing operation may be performed while measuring positional deviations between the mold 3 and the substrate 2 by the alignment measurement unit 8 each time the mold 3 is pressed. In this case, a pressing position and an inclination by the mold stage 14, and a correction amount of a magnification correction by the magnification correction mechanism 15, or the control unit 10 (or the cavity pressure control unit) are determined such that the overlay accuracy is improved.

In other words, the control unit 10 performs control of the magnification correction mechanism 15 (deformation mechanism), based on the information concerning a difference in shape. Further, the control unit 10 can concurrently perform control of the spacing adjustment mechanism, based on information concerning a difference in shape and information concerning spacing. The control unit 10 can also concurrently perform control of an inclination adjustment mechanism based on the information concerning a difference in shape and the information concerning inclinations. Furthermore, the control unit 10 can perform control of the pressure adjustment mechanism together based on the information concerning a difference in shape. So as to reduce remaining difference in shape between the pattern area P and the already formed shot in a state where the pattern area P is deformed by performing a control of any one of these four controls, another one of the four controls is executed.

In consideration of concurrent executability of the four controls, the present exemplary embodiment is to generate control data such as correction amounts, spacing (distances), inclinations, and pressure values for use with the above controls. Of course, if difference in shape is almost eliminated by one control of the above four controls, it is not necessary to perform other controls. Further, it is acceptable to perform one control, using two of the above four controls, then to reduce residual difference in shape remaining even so by the other control. As described above the control data may be created in advance, using the inspection device. Further, if the alignment measurement unit 8, in a state where the pattern area P is in contact with the imprint material, can measure relative positions between a plurality of marks of the pattern area P and a plurality of marks of the shot and can acquire information concerning a difference in shape, the shapes may be allowed to be matched during the contacting state.

For example, the spacing between the mold 3 and the substrate 2 may be determined, according to corrected shape of the pattern of the mold 3. Specifically, the spacing between the mold 3 and the substrate 2 may be determined according to deformation in a pressing direction of the mold 3 generated when the shape of the mold 3 is corrected by the magnification correction mechanism 15. In this case, it is necessary to determine in advance a relationship between deformation of the pattern area of the mold 3 by the magnification correction mechanism 15, and deformation of the pattern area of the mold 3 resulting from the spacing between the mold 3 and the substrate 2.

A third exemplary embodiment will be described. A manufacturing method of devices as articles includes a step for transferring (forming) a pattern onto a substrate (e.g., wafer, glass plate, film-like substrate), using the imprint apparatus 1. Such manufacturing method further includes a step for etching a substrate onto which the pattern has been transferred. Such manufacturing method, when other articles such as pattern dot media (recording media) or optical elements are manufactured, includes other processing steps for processing the substrate onto which the pattern has been transferred, in place of the etching step.

Hereinabove, the exemplary embodiments of the present invention have been described, but the present invention is of course not limited to these exemplary embodiments, and various variations and modifications within the scope of the spirit are possible.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-175897 filed Aug. 11, 2011, which is hereby incorporated by reference herein in its entirety.

What is claimed is:

1. An imprint apparatus configured to mold an imprint material on a substrate using a mold, and to form a pattern on the substrate, the imprint apparatus comprising:
    a mold holding unit configured to hold the mold, which includes a surface including a pattern area;
    a substrate holding unit configured to hold the substrate;
    a first acquisition unit configured to acquire a difference in shape between a shape of the pattern area and a shape of a shot region already formed on the substrate; and
    a control unit configured to control at least one of the mold holding unit and the substrate holding unit to adjust a spacing between the mold and the substrate, in a state where the pattern area and the imprint material are in contact with each other, based on the difference in shape acquired by the first acquisition unit, so as to reduce the difference in shape between the shape of the pattern area and the shape of the shot region.

2. The imprint apparatus according to claim 1, further comprising a second acquisition unit configured to acquire an information concerning the spacing between the mold and the substrate; and
    wherein the control unit configured to control at least one of the mold holding unit and the substrate holding unit to adjust the spacing between the mold and the substrate, based on the information concerning the spacing between the mold and the substrate acquired by the second acquisition unit.

3. The imprint apparatus according to claim 2, wherein the information concerning the spacing is at least one of a value obtained by measuring distance between the mold and the substrate, and a value of force generated between the mold and the substrate in a state where the pattern area and the imprint material are in contact with each other.

4. The imprint apparatus according to claim 1, wherein the difference in shape between the pattern area and the shot region already formed on the substrate, is information of relative positions between a plurality of marks formed on the pattern area, and a plurality of marks formed on the shot region.

5. The imprint apparatus according to claim 1, wherein the mold holding unit is configured to include a deformation mechanism configured to be capable of deforming the pattern area of the mold even in a state where the mold is not in contact with the imprint material, and
    wherein the control unit is configured to perform at least one of controls of a control of the deformation mechanism based on the difference in shape, and a control of at least one of the mold holding unit and the substrate holding unit based on the difference in shape and information concerning the spacing, and
    wherein the deformation mechanism impresses the force upon the mold or deforms the pattern area of the mold by heating the mold.

6. The imprint apparatus according to claim 5, wherein the control unit is configured, so as to reduce remaining difference in shape between the pattern area and the already formed shot region in a state where the pattern area is deformed by performing one of the controls of the control of the deformation mechanism and the control at least one of the mold holding unit and the substrate holding unit, to control the other one of the controls of the deformation mechanism and the control of at least one of the mold holding unit and the substrate holding unit.

7. The imprint apparatus according to claim 5, wherein the deformation mechanism is a mechanism that exerts forces to side surfaces of the mold from two directions orthogonal to each other in a plane perpendicular to a direction in which the spacing between the mold and the substrate is adjusted by controlling at least one of the mold holding unit and the substrate holding unit,
wherein the mold includes a cavity for deforming the mold on a back side of the plane, and includes a pressure adjustment mechanism configured to adjust a pressure in the cavity, and
wherein the control unit is configured to perform any one of controls of the control of the deformation mechanism based on the difference in shape, the control of at least one of the mold holding unit and the substrate holding unit based on the difference in shape and the information concerning the spacing, and the control of the pressure adjustment mechanism based on the information concerning the difference in shape.

8. The imprint apparatus according to claim 7, wherein the control unit is configured, so as to reduce remaining difference in shape between the pattern area and the already formed shot region in a state where the pattern area is deformed by performing one of the controls of the control of the deformation mechanism based on the difference in shape, the control of at least one of the mold holding unit and the substrate holding unit based on the difference in shape and the information concerning the spacing, and the control of the pressure adjust mechanism based on the difference in shape, to control the other one of the controls of the control of the deformation mechanism based on the difference in shape, the control of at least one of the mold holding unit and the substrate holding unit based on the difference in shape and the information concerning the spacing, and the control of the pressure adjustment mechanism based on the difference in shape.

9. The imprint apparatus according to claim 7, wherein the first acquisition unit is configured to be capable of acquiring a remaining difference in shape between the pattern area and the already formed shot region in a state where the pattern area is deformed by performing any one of the controls of the control of the deformation mechanism based on the difference in shape, the control of the spacing adjust mechanism based on the difference in shape and the information concerning the spacing, and the control of the pressure adjustment mechanism based on the difference in shape.

10. An imprint apparatus configured to mold an imprint material on a substrate using a mold, and to form a pattern on the substrate, the imprint apparatus comprising:
a mold holding unit configured to hold the mold, which includes a surface including a pattern area;
a substrate holding unit configured to hold the substrate;
a first acquisition unit configured to acquire a difference in shape between a shape of the pattern area and a shape of a shot region already formed on the substrate; and
a control unit configured to control at least one of the mold holding unit and the substrate holding unit to adjust an inclination between the mold and the substrate, in a state where the pattern area and the imprint material are in contact with each other, based on the difference in shape acquired by the first acquisition unit, so as to reduce the difference in shape between the shape of the pattern area and the shape of the shot region.

11. The imprint apparatus according to claim 10, further comprising a second acquisition unit configured to acquire an information concerning the inclination between the mold and the substrate; and
wherein the control unit configured to control at least one of the mold holding unit and the substrate holding unit to adjust the inclination between the mold and the substrate, based on the information concerning the inclination between the mold and the substrate acquired by the second acquisition unit.

12. An article manufacturing method comprising:
forming a pattern on a substrate using an imprint apparatus; and
processing the substrate on which the pattern has been formed by the formation,
wherein the imprint apparatus configured to mold an imprint material on a substrate using a mold, and to form a pattern on the substrate, the imprint apparatus comprising:
a mold holding unit configured to hold the mold, which includes a surface including a pattern area;
a substrate holding unit configured to hold the substrate;
a first acquisition unit configured to acquire a difference in shape between a shape of the pattern area and a shape of a shot region already formed on the substrate; and
a control unit configured to control at least one of the mold holding unit and the substrate holding unit to adjust a spacing between the mold and the substrate, in a state where the pattern area and the imprint material are in contact with each other, based on the difference in shape acquired by the first acquisition unit, so as to reduce the difference in shape between the shape of the pattern area and the shape of the shot region.

13. An article manufacturing method comprising:
forming a pattern on a substrate using an imprint apparatus; and
processing the substrate on which the pattern has been formed by the formation,
wherein the imprint apparatus configured to mold an imprint material on a substrate using a mold, and to form a pattern on the substrate, the imprint apparatus comprising:
a mold holding unit configured to hold the mold, which includes a surface including a pattern area;
a substrate holding unit configured to hold the substrate;
a first acquisition unit configured to acquire a difference in shape between a shape of the pattern area and a shape of a shot region already formed on the substrate; and
a control unit configured to control at least one of the mold holding unit and the substrate holding unit to adjust an inclination between the mold and the substrate, in a state where the pattern area and the imprint material are in contact with each other, based on the difference in shape acquired by the first acquisition unit, so as to reduce the difference in shape between the shape of the pattern area and the shape of the shot region.

14. An imprint apparatus configured to mold an imprint material on a substrate using a mold, and to form a pattern on the substrate, the imprint apparatus comprising:
a mold holding unit configured to hold the mold, which includes a surface including a pattern area and includes a cavity for deforming the mold on a back side of the surface;
a substrate holding unit configured to hold the substrate;

a pressure adjustment mechanism configured to adjust a pressure in the cavity;

a first acquisition unit configured to acquire information concerning a shape of the pattern area of the mold being deformed by adjusting a pressure of the cavity with the pressure adjustment mechanism; and the control unit configured to control at least one of the mold holding unit and the substrate holding unit to adjust a spacing between the mold and the substrate, based on the information concerning the shape of the pattern area acquired by the first acquisition unit.

* * * * *